(12) United States Patent
Mao et al.

(10) Patent No.: US 11,569,332 B2
(45) Date of Patent: Jan. 31, 2023

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Ming Mao, Beijing (CN); Pan Zhao, Beijing (CN); Li Song, Beijing (CN); Ge Wang, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 290 days.

(21) Appl. No.: 16/959,370

(22) PCT Filed: Dec. 25, 2019

(86) PCT No.: PCT/CN2019/128251
§ 371 (c)(1),
(2) Date: Jun. 30, 2020

(87) PCT Pub. No.: WO2020/143449
PCT Pub. Date: Jul. 16, 2020

(65) Prior Publication Data
US 2021/0074796 A1    Mar. 11, 2021

(30) Foreign Application Priority Data
Jan. 8, 2019 (CN) .......................... 201910016093.X

(51) Int. Cl.
*H01L 27/12* (2006.01)
*H01L 27/32* (2006.01)
*H01L 51/52* (2006.01)

(52) U.S. Cl.
CPC ...... *H01L 27/3276* (2013.01); *H01L 27/3246* (2013.01); *H01L 27/3258* (2013.01)

(58) Field of Classification Search
CPC ..... H01L 27/12; H01L 27/1248; H01L 27/32; H01L 27/323; H01L 27/3225;
(Continued)

(56) References Cited

U.S. PATENT DOCUMENTS

2016/0285038 A1    9/2016  Kim
2016/0307971 A1*  10/2016  Jeon ................. H01L 27/3225
2018/0026225 A1*   1/2018  Kwon ............... H01L 51/5237
                                                              257/40

FOREIGN PATENT DOCUMENTS

CN    103681536 A    3/2014
CN    106409869 A    2/2017
(Continued)

OTHER PUBLICATIONS

First Office Action dated May 13, 2020, for corresponding Chinese application 201910016093.X.
(Continued)

*Primary Examiner* — Fazli Erdem
(74) *Attorney, Agent, or Firm* — Nath, Goldberg & Meyer; Joshua B. Goldberg

(57) ABSTRACT

A display substrate and a display device are provided in the present invention. The display substrate includes a base substrate, and a positive power supply line, a negative power supply line and a first dam which are on the base substrate. The base substrate includes a display region and a peripheral region arranged around the display region. The positive
(Continued)

power supply line, the negative power supply line and the first dam are in the peripheral region, and the first dam is arranged around the display region. At least in a corresponding region between the positive power supply line and the negative power supply line, a protruding structure is on a side of the first dam proximal to the display region.

20 Claims, 2 Drawing Sheets

(58) Field of Classification Search
CPC ............ H01L 27/3246; H01L 27/3248; H01L 27/3258; H01L 27/3276; H01L 51/52; H01L 51/5237
USPC .......................................................... 257/40
See application file for complete search history.

(56) References Cited

FOREIGN PATENT DOCUMENTS

| CN | 106933431 A | 7/2017 |
| CN | 106951125 A | 7/2017 |
| CN | 107887405 A | 4/2018 |
| CN | 108305889 A | 7/2018 |
| CN | 207852679 U | 9/2018 |
| CN | 109728063 A | 5/2019 |

OTHER PUBLICATIONS

Second Office Action dated Oct. 14, 2020, for corresponding Chinese application 201910016093.X.

* cited by examiner

DISPLAY SUBSTRATE AND DISPLAY DEVICE

CROSS-REFERENCE TO RELATED APPLICATIONS

This is a National Phase Application filed under 35 U.S.C. 371 as a national stage of PCT/CN2019/128251, filed Dec. 25, 2019, an application claiming the benefit of Chinese Application No. 201910016093.X, filed Jan. 8, 2019, the content of each of which is hereby incorporated by reference in its entirety.

TECHNICAL FIELD

The invention relates to the field of display technology, in particular, to a display substrate and a display device.

BACKGROUND

Recently, during a packaging process of a flexible OLED display, an organic packaging structure among various packaging structures is generally manufactured by using an Ink-Jet Printing (IJP). During a manufacturing process, ink used for manufacturing the organic packaging structure has fluidity, and it is particularly important to prevent the ink from overflowing in order to ensure yield of the IJP.

SUMMARY

As an aspect, a display substrate is provided in the present invention. The display substrate includes a base substrate, and a positive power supply line, a negative power supply line and a first dam which are on the base substrate. The base substrate is divided into a display region and a peripheral region arranged around the display region. The positive power supply line, the negative power supply line and the first dam are in the peripheral region, and the first dam is arranged around the display region.

At least in a corresponding region between the positive power supply line and the negative power supply line, a protruding structure is on a side of the first dam proximal to the display region.

Optionally, the protruding structure has a width in a range from 50 microns to 80 microns along a first direction, the first direction being a direction from the first dam to the display region.

Optionally, the protruding structure has a width of 65 microns along the first direction.

Optionally, the first dam has a height in a range from 4 microns to 5 microns along a second direction perpendicular to the first direction, the first direction being a direction from the first dam to the display region.

Optionally, the first dam has a height of 4.5 microns along the second direction.

Optionally, the first dam includes a first dam structure, a second dam structure, and a third dam structure. The first dam structure is on the base substrate, the second dam structure is on a side of the first dam structure distal to the base substrate, and the third dam structure is on a side of the second dam structure distal to the first dam structure.

Optionally, the protruding structure is on the same layer as the first dam, and the protruding structure and the first dam are formed as one piece.

Optionally, an edge of the protruding structure proximal to the display region has an arc shape.

Optionally, an orthographic projection of the protruding structure on the base substrate has a rectangular shape.

As another aspect, a display device including the display substrate described above is provided.

DETAILED DESCRIPTION

To enable one of ordinary skill in the art to better understand the technical solutions of the present disclosure, the display substrate and the display device according to the present disclosure will be described in detail below with reference to the accompanying drawings.

In the related art, a packaging performance of the flexible OLED display is affected by the poor effect of preventing the ink from overflowing out.

Figure 1:
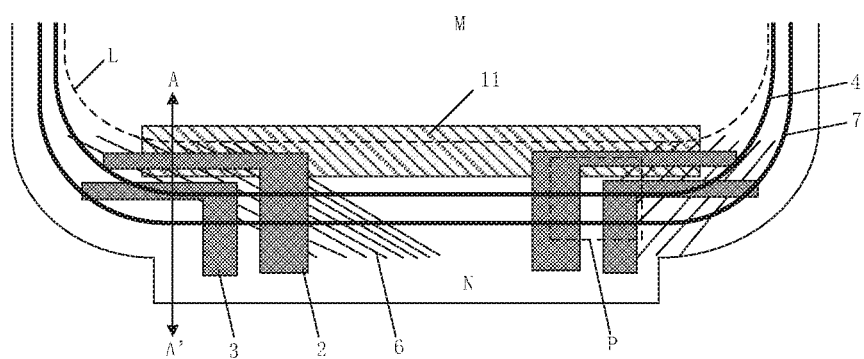
FIG. 1 is a schematic diagram showing a structure of a display substrate according to an embodiment of the present invention.
Figure 2:
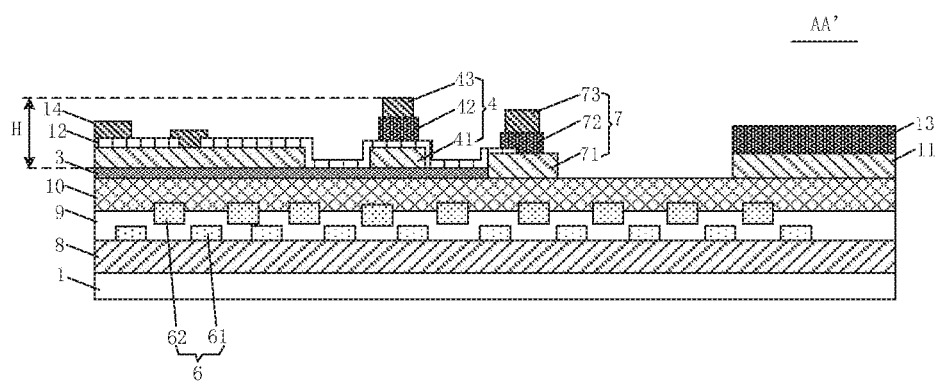
FIG. 2 is a cross-sectional view of the display substrate taken along line AA' in FIG. 1.
Figure 3:
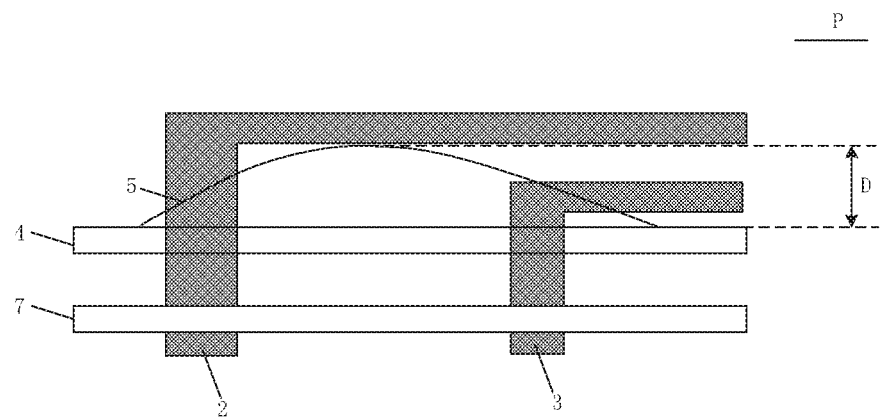
FIG. 3 is a schematic diagram showing a structure in the region P in FIG. 1.

FIG. 1 is a schematic diagram showing a structure of a display substrate according to an embodiment of the present invention. FIG. 2 is a cross-sectional view of the display substrate taken along line AA' in FIG. 1. FIG. 3 is a schematic diagram showing a structure in the region P in FIG. 1. As shown in FIGS. 1 to 3, the display substrate includes a base substrate 1 and a positive power supply line 2, a negative power supply line 3, a first dam 4 that are located on the base substrate 1. The base substrate 1 includes a display region M and a peripheral region N disposed around the display region. The positive power supply line 2, the negative power supply line 3, and the first dam 4 are located in the peripheral region N, and the first dam 4 is arranged around the display region M. At least in a corresponding region P between the positive power supply line 2 and the negative power supply line 3, a protruding structure 5 is formed on a side of the first dam 4 proximal to the display region M.

In an embodiment, as shown in FIG. 1, a region surrounded by the dotted line L is the display region M, and a region surrounding the display region M is the peripheral region N. It should be noted that FIG. 1 shows only a portion of the display region M and the peripheral region N located below the portion of the display region M, that is to say, FIG. 1 shows a structure of a lower border of the display substrate.

In the peripheral region N, since a groove is formed between the positive power supply line 2 and the negative power supply line 3, a height of the first dam 4 in the region (i.e., the region P) corresponding to the groove is lower than a height of the first dam 4 in the other regions. When the IJP ink is drained through the groove, the ink collected in the groove can easily overflow from the first dam 4 with a low height, thereby resulting in a fault of the display device. Therefore, in the embodiment, in the corresponding region P between the positive power supply line 2 and the negative power supply line 3, the protruding structure 5 is formed on a side of the first dam 4 proximal to the display region M. The protruding structure 5 can disperse and drain the ink collected in the region P, so that the ink in the region P cannot easily overflow from the first dam 4 in the region P, thereby ensuring the yield, packaging performance, and packaging reliability of the display device. A direction from the first dam 4 towards/to the display region M is taken as a first direction, and the direction perpendicular to the first direction is taken as a second direction, and the above-mentioned height can be understood as a height of the first dam 4 along the second direction. As shown in FIG. 1, the direction AA' is the first direction, and the direction perpendicular to the direction AA' is the second direction.

In the embodiment, as shown in FIG. 3, the protruding structure 5 is formed to protrude along the direction towards the display region M (i.e., the first direction). In an embodiment, the protruding structure 5 is formed in the same layer as the first dam 4, and the protruding structure 5 and the first dam 4 are formed as one piece. In other words, a portion of the first dam 4 extending along the direction (i.e., the AA' direction) towards the display region M serves as or is the protruding structure 5. In the corresponding region P between the positive power supply line 2 and the negative power supply line 3, a height of the protruding structure 5 along the second direction may be the same height as the first dam 4, or may be lower than the height of the first dam 4, as long as the protruding structure 5 can disperse the ink in the drainage region P.

In the embodiment, as shown in FIG. 3, a width D of the protruding structure 5 along the first direction is in a range from 50 microns to 80 microns. The first direction (i.e., the AA' direction) is a direction from the first dam 4 to the display region M. In an embodiment, the protruding structure 5 has a width D of 65 microns along the first direction. As shown in FIG. 3, it is understood that when an orthographic projection of the protruding structure 5 on the base substrate 1 has an irregular pattern (e.g., an arc-shaped pattern as shown in FIG. 3), the width D of the protruding structure 5 along the first direction is the maximum width of the protruding structure 5 along the first direction.

Figure 4:
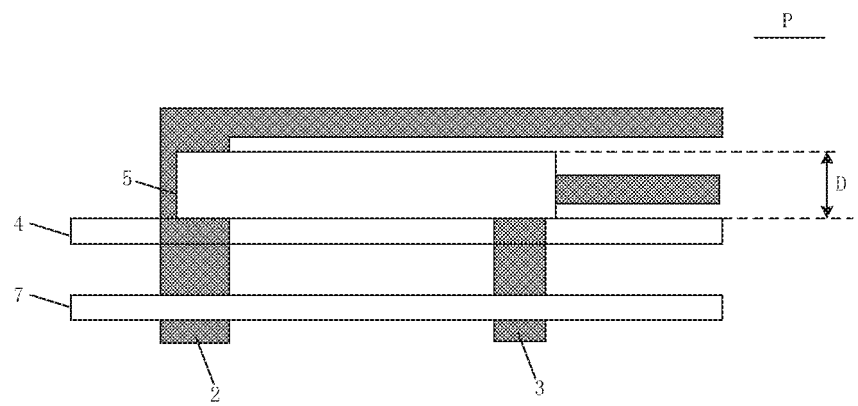
FIG. 4 is a schematic diagram showing a structure in the region P in FIG. 1.

FIG. 3 shows a schematic diagram showing a structure of the protruding structure. As shown in FIG. 3, an edge of the protruding structure 5 proximal to the display region has an arc shape. FIG. 4 is schematic diagram showing another structure of the region P in FIG. 1. As shown in FIG. 4, an orthographic projection of the protruding structure 5 on the base substrate 1 has a rectangular shape in the embodiment, the protruding structure 5 may also have other shape, which will not be described here.

In the embodiment, as shown in FIG. 2, the first dam 4 has a height H in a range from 4 microns to 5 microns along the second direction perpendicular to the first direction. In an embodiment, the first dam 4 has a height H of 4.5 microns along the second direction. Therefore, the ink of IJP can be effectively prevented from overflowing from the first dam 4.

In the embodiment, the display substrate further includes gate metal lines 6 located in the peripheral region N on the base substrate 1. Between the edge of the display region M and the first dam 4, a groove between the gate metal lines 6 has a significant drainage effect on the flow of ink of IJP. Therefore, in order to effectively block the flow of ink of IJP, prevent the ink of IJP from overflowing, meanwhile reduce a distance from an edge of the display region M to the first dam 4 to a certain extent, and realize a narrow bezel design, in the embodiment, optionally, the first dam 4 includes a first dam structure 41, a second dam structure 42, and a third dam structure 43. The first dam structure 41 is located on the base substrate 1, the second dam structure 42 is located on a side of the first dam structure 41 distal to the base substrate 1, and the third dam structure 43 is located on a side of the second dam structure 42 distal to the first dam structure 41. In the embodiment, the first dam 4 has a three-layer structure, the first dam 4 is arranged around the display region M in peripheral region N, and the first dam 4 has a height H of 4.5 microns along the second direction, thereby effectively preventing the ink of IJP from overflowing from the first dam 4, ensuring the yield and packaging reliability of the display substrate, and meanwhile decreasing a distance from the edge of display region M to the first dam 4 to a certain extent, and realizing the narrow bezel design of the lower border.

In the embodiment, similar to the first dam 4, the protruding structure 5 may also have a three-layer structure, specifically referring to the description of the three-layer structure of the first dam 4, and details thereof are not repeated here.

In an embodiment, as shown in FIGS. 1 to 3, the display substrate further includes a second dam 7 on the base substrate 1. The second dam 7 is located on a side of the first dam 4 distal to the display region M and arranged around the first dam 4. The second dam 7 includes a first dam portion 71, a second dam portion 72 and a third dam portion 73. The first dam portion 71 is located on the base substrate 1, the second dam portion 72 is located on a side of the first dam portion 71 distal to the base substrate 1, and the third dam portion 73 is located on a side of the second dam portion 72 distal to the first dam portion 71.

In an embodiment, the display substrate is an OLED display substrate. Optionally, the OLED display substrate is a flexible OLED display substrate. The display region M includes a thin film transistor (TFT) on the base substrate 1, a pixel defining layer (not shown in the drawings), and pixel units (not shown in the drawings) defined by the pixel defining layer. A pixel unit includes an anode, a cathode, and an organic light-emitting layer between the anode and the cathode. The organic light-emitting layer includes a hole injection layer, a hole transport layer, an electroluminescent layer, an electron transport layer, and an electron injection layer. The anode is connected with source and drain electrodes of the thin film transistor, and the anode is also connected with a negative power supply line (VSS) 3 in the peripheral region N. The cathode is connected with a positive power supply line (VDD) 2 in the peripheral region N. The positive power supply line 2 and the negative power supply line 3 may apply a voltage to the anode and the cathode so as to drive the organic light-emitting layer to emit light, thereby realizing display.

In the embodiment, the positive power supply line 2 and the negative power supply line 3 are disposed on a same layer, as shown in FIG. 2, and the first dam 4 is located on a side of the negative power supply line 3 distal to the base substrate 1. The material of the positive power supply line 2 and the negative power supply line 3 are the same as that of the source and drain electrodes of the thin film transistor.

In the embodiment, as shown in FIG. 2, the gate metal lines 6 include first gate metal lines 61 and second gate metal lines 62. In the peripheral region N, the display substrate further includes an inorganic layer 8, an insulation layer 9, an interlayer dielectric layer (ILD) 10, a planarization layer (PLN) 11, an anode line 12, a pixel defining layer (PDL) 13, and a spacer (PS) 14 that are located on the base substrate 1.

Specifically, the inorganic layer 8 is located on the base substrate 1. The first gate metal lines 61 are located on a side of the inorganic layer 8 distal to the base substrate 1. The insulation layer 9 is located on a side of the first gate metal lines 61 distal to the inorganic layer 8. The second gate metal lines 62 are located on a side of the insulation layer 9 distal to the first gate metal lines 61. The interlayer dielectric layer 10 is located on a side of the second gate metal lines 62 distal to the insulation layer 9. The negative power supply line 3 is located on a side of the interlayer dielectric layer 10 distal to the second gate metal lines 62. The planarization layer 11 is located on a side of the negative power supply line 3 distal to the interlayer dielectric layer 10. The first dam structure 41, the first dam portion 71 and the planarization layer 11 made of a same material are formed in a same layer. The anode line 12 is located on a side of the planarization layer 11 distal to the negative power supply line 3. The pixel defining layer 13 is located on a side of the anode line 12 distal to the planarization layer 11. The second dam structure 42, the second dam portion 72 and the pixel defining layer 13 made of a same material are formed in a same layer. The spacer 14 is located on a side of the pixel defining layer 13 distal to the anode line 12. The third dam structure 43, the third dam portion 73 and the spacer 14 made of a same material are formed in a same layer.

In the technical solution of the display substrate provided in the embodiment, at least in a corresponding region between the positive power supply line and the negative power supply line, a protruding structure is formed on a side of the first dam proximal to the display region. The protruding structure can disperse and drain, to a certain extent, the ink collected in the corresponding area between the positive power supply line and the negative power supply line, therefore the flow of ink of IJP can be effectively blocked, so that the ink cannot easily overflow from the first dam, and the yield and the packaging performance of the display substrate can be ensured.

A display device is further provided in the present invention. The display device includes a display substrate which is the display substrate describe above, detailed description of the display device can be referenced to the foregoing embodiments, and details thereof are not repeated herein.

In the technical solution of the display device provided in the embodiment, at least in a corresponding region between the positive power supply line and the negative power supply line, a protruding structure is formed on a side of the first dam proximal to the display region. The protruding structure can disperse and drain, to a certain extent, the ink collected in the corresponding area between the positive power supply line and the negative power supply line, therefore the flow of ink of IJP can be effectively blocked, so that the ink cannot easily overflow from the first dam, and the yield and the packaging performance of the display substrate can be ensured.

It should be understood that the above implementations are merely exemplary embodiments for the purpose of illustrating the principles of the present disclosure. However, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. A display substrate comprising;
a base substrate; and
a positive power supply line, a negative power supply line and a first dam which are on the base substrate; wherein
the base substrate has a display region and a peripheral region arranged around the display region,
the positive power supply line, the negative power supply line and the first dam are in the peripheral region, and the first dam surrounds the display region; a direction from the first dam to the display region being a first direction, a direction from the base substrate to the first dam and perpendicular to the first direction being a second direction,
at least in a corresponding region of the peripheral region between the positive power supply line and the negative power supply line, a protruding structure, which is a portion of the first dam extending along the first direction, is on a side of the first dam proximal to the display region, and
in the corresponding region of the peripheral region, an entire orthographic projection the protruding structure on the base substrate is in directly contact with but does not overlap an orthographic projection of the first dam on the base substrate.

2. The display substrate of claim 1, wherein the protruding structure has a width in a range from 50 microns to 80 microns along the first direction.

3. The display substrate of claim 2, wherein the protruding structure has a width of 65 microns along the first direction.

4. The display substrate of claim 1, wherein the first dam has a height in a range from 4 microns to 5 microns along the second direction.

5. The display substrate of claim 4, wherein the first dam has a height of 4.5 microns along the second direction.

6. The display substrate of claim 1, wherein
the first dam comprises a first dam structure, a second dam structure, and a third dam structure,
the first dam structure is on the base substrate,
the second dam structure is on a side of the first dam structure distal to the base substrate, and
the third dam structure is on a side of the second dam structure distal to the first dam structure.

7. The display substrate of claim 6, wherein
the protruding structure is on the same layer as the first dam, and
the protruding structure and the first dam are formed as one piece.

8. The display substrate of claim 1, wherein an edge of the protruding structure proximal to the display region has an arc shape.

9. The display substrate of claim 1, wherein an orthographic projection of the protruding structure on the base substrate has a rectangular shape.

10. A display device comprising the display substrate of claim 1.

11. The display substrate of claim 6, wherein
a width of the first dam structure along the first direction is larger than a width of the second dam structure along the first direction, and
a width of the second dam structure along the first direction is larger than a width of the third dam structure along the first direction.

12. The display substrate of claim 11, further comprising a second dam, wherein
the second dam is on the base substrate, on a side of the first dam distal to the display region, and around the first dam.

13. The display substrate of claim 12, wherein
the second dam comprise a first dam portion, a second dam portion, and a third dam portion,
the first dam portion is on the base substrate,
the second dam portion is on a side of the first dam portion distal to the base substrate, and
the third dam portion is on a side of the second dam portion distal to the base substrate.

14. The display substrate of claim 13, wherein
a width of the first dam portion along the first direction is larger than a width of the second dam portion along the first direction, and
a width of the second dam portion along the first direction is larger than a width of the third dam portion along the first direction.

15. The display substrate of claim 14, wherein
a distance from a top surface of the first dam structure to the base substrate is larger than a distance from a top surface of the first dam portion to the base substrate,
a distance from a top surface of the second dam structure to the base substrate is larger than a distance from a top surface of the second dam portion to the base substrate, and
a distance from a top surface of the third dam structure to the base substrate is larger than a distance from a top surface of the third dam portion to the base substrate.

16. The display substrate of claim 15, wherein
the protruding structure further comprises three protruding portions,
portions of the first dam structure, the second dam structure, and the third dam structure of the firs dam extending along the first direction serve as the three protruding portions of the protruding structure respectively.

17. The display substrate of claim 16, further comprising a thin film transistor, a pixel defining layer, pixel units defined by the pixel defining layer, an insulation layer, an interlayer dielectric layer, and a planarization layer on the base substrate, wherein
the pixel unit comprises an anode, a cathode, and an organic light-emitting layer between the anode and the cathode,
the interlayer dielectric layer is on a side of the insulation layer distal to the base substrate,
the negative power supply line is on a side of the interlayer dielectric layer distal to the base substrate,
the first dam structure of the first dam is on a side of the negative power supply line distal to the base substrate, the first dam structure comprising the same material as the planarization layer,
the anode of the pixel unit is on a side of the first dam structure distal to the base substrate, and
the second dam structure of the first dam is on a side of the anode distal to the base substrate, the second dam structure comprising the same material as the pixel defining layer.

18. The display substrate of claim 17, wherein
the first dam portion of the second dam is on a side of the interlayer dielectric layer distal to the base substrate, the first dam portion comprising the same material as the planarization layer,
the anode of the pixel unit is on a side of the first dam portion of the second dam distal to the base substrate, and
the second dam portion of the second dam is on a side of the anode and the first dam portion distal to the base substrate, the second dam portion comprising the same material as the pixel defining layer.

19. The display substrate of claim 18, wherein
a distance from the first dam and the second dam is less than a distance from the second dam to the pixel defining layer.

20. The display substrate of claim 1, wherein
the base substrate comprises a bonding region as a portion of the peripheral region,
the bonding region is on a side of the display region along the first direction,
the positive power supply line and the negative power supply line extend from the bonding region to the display region, and
each of orthographic projections of the positive power supply line and the negative power supply line on the base substrate has an L shape.

* * * * *